(12) United States Patent
Jennings et al.

(10) Patent No.: US 7,910,499 B2
(45) Date of Patent: Mar. 22, 2011

(54) AUTOFOCUS FOR HIGH POWER LASER DIODE BASED ANNEALING SYSTEM

(75) Inventors: Dean Jennings, Beverly, MA (US); Timothy N. Thomas, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 11/198,660

(22) Filed: Aug. 5, 2005

(65) Prior Publication Data

US 2006/0105585 A1 May 18, 2006

Related U.S. Application Data

(60) Provisional application No. 60/627,530, filed on Nov. 12, 2004.

(51) Int. Cl.
*H01L 21/00* (2006.01)

(52) U.S. Cl. .................................. 438/795; 438/473

(58) Field of Classification Search .................. 438/795, 438/473

See application file for complete search history.

(56) References Cited

U.S. PATENT DOCUMENTS

| | | | |
|---|---|---|---|
| 3,778,791 A | 12/1973 | Lewicki et al. | 179/100.2 |
| 4,305,640 A | 12/1981 | Cullis et al. | 350/96.1 |
| 4,448,547 A | 5/1984 | Wickersheim | 374/131 |
| 4,647,774 A | 3/1987 | Brisk et al. | 250/338 |
| 4,730,113 A | 3/1988 | Edwards et al. | 250/347 |
| 4,818,886 A | 4/1989 | Drucker | 250/566 |
| 5,463,202 A | 10/1995 | Kurosawa et al. | 219/121.83 |
| 5,861,992 A | 1/1999 | Gelbart | 359/619 |
| 6,040,787 A | 3/2000 | Durham | 340/932.2 |
| 6,080,236 A * | 6/2000 | McCulloch et al. | 117/4 |
| 6,240,116 B1 | 5/2001 | Lang et al. | 372/50 |
| 6,494,371 B1 * | 12/2002 | Rekow et al. | 235/454 |
| 6,530,687 B1 | 3/2003 | Suzuki et al. | 374/131 |
| 6,531,681 B1 | 3/2003 | Markle et al. | 219/121.69 |
| 6,747,245 B2 | 6/2004 | Talwar et al. | 219/121.8 |
| 6,771,686 B1 | 8/2004 | Ullman et al. | 372/92 |
| 6,780,692 B2 | 8/2004 | Tatsuiki et al. | 438/166 |
| 6,809,012 B2 | 10/2004 | Yamazaki et al. | 438/473 |
| 6,847,457 B2 | 1/2005 | Tobiason et al. | 356/495 |
| 6,895,164 B2 | 5/2005 | Saccomanno | 385/146 |
| 6,987,240 B2 | 1/2006 | Jennings et al. | 219/121.8 |
| 7,005,601 B2 | 2/2006 | Jennings | 219/121.66 |

(Continued)

FOREIGN PATENT DOCUMENTS

DE        10339237        3/2004

(Continued)

OTHER PUBLICATIONS

Official Action Dated Dec. 31, 2009 Issued in Co-Pending U.S. Appl. No. 12/283,615.

(Continued)

*Primary Examiner* — Thao X Le
*Assistant Examiner* — Tanika Warrior
(74) *Attorney, Agent, or Firm* — Law Office of Robert M. Wallace

(57) ABSTRACT

Apparatus for thermally processing a substrate includes a source of laser radiation comprising a plurality diode lasers arranged along a slow axis, optics directing the laser radiation from the source to the substrate, and an array of photodetectors arranged along a fast axis perpendicular to the slow axis and receiving portions of the laser radiation reflected from the substrate through the optics.

11 Claims, 7 Drawing Sheets

U.S. PATENT DOCUMENTS

| | | |
|---|---|---|
| 7,129,440 B2 | 10/2006 | Adams et al. ............ 219/121.65 |
| 7,135,392 B1 | 11/2006 | Adams et al. ................. 438/166 |
| 7,494,272 B2 | 2/2009 | Thomas et al. ................. 374/53 |
| 2003/0196996 A1* | 10/2003 | Jennings et al. ......... 219/121.73 |
| 2004/0095983 A1 | 5/2004 | Whitley ........................ 372/108 |
| 2004/0136662 A1 | 7/2004 | Takagi et al. ................... 385/92 |
| 2004/0149217 A1 | 8/2004 | Collins et al. ................. 118/723 |
| 2004/0179807 A1 | 9/2004 | Tanaka ......................... 385/146 |
| 2004/0188399 A1 | 9/2004 | Smart ...................... 219/121.69 |
| 2004/0198028 A1 | 10/2004 | Tanaka et al. ................. 438/487 |
| 2004/0263986 A1 | 12/2004 | Brown .......................... 359/626 |
| 2005/0063451 A1 | 3/2005 | Abe et al. ...................... 374/121 |
| 2005/0175285 A1 | 8/2005 | Reynolds et al. ............... 385/39 |
| 2006/0008237 A1 | 1/2006 | Imade .......................... 385/146 |
| 2006/0102599 A1 | 5/2006 | Adams et al. ................. 438/795 |
| 2006/0102607 A1 | 5/2006 | Adams et al. ................. 374/126 |
| 2006/0114572 A1 | 6/2006 | Bittner ......................... 359/641 |
| 2008/0025368 A1 | 1/2008 | Aderhold et al. ............. 374/102 |
| 2008/0210671 A1 | 9/2008 | Jennings et al. ......... 219/121.61 |
| 2009/0200279 A1 | 8/2009 | Li ............................ 219/121.66 |
| 2009/0296774 A1 | 12/2009 | Koelmel et al. ............... 374/121 |

FOREIGN PATENT DOCUMENTS

| | | |
|---|---|---|
| EP | 0 231 794 A2 | 8/1987 |
| EP | 0458388 A1 | 11/1991 |
| JP | 57099747 | 6/1982 |
| JP | 57-167692 | 10/1992 |
| JP | 2001-91231 A | 3/2000 |
| WO | WO 03/089184 A1 | 10/2003 |
| WO | WO 2004/044955 | 5/2004 |

OTHER PUBLICATIONS

Official Action Dated Apr. 7, 2010 Issued in Co-Pending U.S. Appl. No. 12/075,798.

Official Action Dated Sep. 15, 2010 Issued in Co-Pending U.S. Appl. No. 12/075,798.

* cited by examiner

US 7,910,499 B2

AUTOFOCUS FOR HIGH POWER LASER DIODE BASED ANNEALING SYSTEM

CROSS REFERENCE TO RELATED APPLICATIONS

This application claims the benefit of U.S. Provisional Application No. 60/627,530, filed Nov. 12, 2004.

This application contains subject matter related to U.S. application Ser. No. 11/185,454 filed Jul. 20, 2005 entitled RAPID DETECTION OF IMMINENT FAILURE IN LASER THERMAL PROCESSING OF A SUBSTRATE by Bruce Adams, et al.; U.S. application Ser. No. 11/185,649 filed Jul. 20, 2005 entitled SINGLE AXIS LIGHT PIPE FOR HOMOGENIZING SLOW AXIS OF ILLUMINATION SYSTEMS BASED ON LASER DIODES by Bruce Adams, et al.; U.S. patent application Ser. No. 11/185,651 filed Jul. 20, 2005 entitled THERMAL FLUX LASER ANNEALING FOR ION IMPLANTATION OF SEMICONDUCTOR P-N JUNCTIONS by Bruce Adams, et al.; and U.S. application Ser. No. 11/195,380 filed Aug. 2, 2005 entitled MULTIPLE BAND PASS FILTERING FOR PYROMETRY IN LASER BASED ANNEALING SYSTEMS by Bruce Adams, et al., all of which applications are assigned to the present assignee.

FIELD OF THE INVENTION

The invention relates generally to thermal processing of semiconductor substrates. In particular, the invention relates to laser thermal processing of semiconductor substrates.

BACKGROUND OF THE INVENTION

Thermal processing is required in the fabrication of silicon and other semiconductor integrated circuits formed in silicon wafers or other substrates such as glass panels for displays. The required temperatures may range from relatively low temperatures of less than 250° C. to greater than 1000°, 1200°, or even 1400° C. and may be used for a variety of processes such as dopant implant annealing, crystallization, oxidation, nitridation, silicidation, and chemical vapor deposition as well as others.

For the very shallow circuit features required for advanced integrated circuits, it is greatly desired to reduce the total thermal budget in achieving the required thermal processing. The thermal budget may be considered as the total time at high temperatures necessary to achieve the desired processing temperature. The time that the wafer needs to stay at the highest temperature can be very short.

Rapid thermal processing (RTP) uses radiant lamps which can be very quickly turned on and off to heat only the wafer and not the rest of the chamber. Pulsed laser annealing using very short (about 20 ns) laser pulses is effective at heating only the surface layer and not the underlying wafer, thus allowing very short ramp up and ramp down rates.

A more recently developed approach in various forms, sometimes called thermal flux laser annealing or dynamic surface annealing (DSA), is described by Jennings et al. in PCT/2003/00196966 based upon U.S. patent application Ser. No. 10/325,497, filed Dec. 18, 2002 and incorporated herein by reference in its entirety. Markle describes a different form in U.S. Pat. No. 6,531,681 and Talwar yet a further version in U.S. Pat. No. 6,747,245.

The Jennings and Markle versions use CW diode lasers to produce very intense beams of light that strikes the wafer as a thin long line of radiation. The line is then scanned over the surface of the wafer in a direction perpendicular to the long dimension of the line beam.

SUMMARY OF THE INVENTION

Apparatus for thermally processing a substrate includes a source of laser radiation comprising a plurality diode lasers arranged along a slow axis, optics directing the laser radiation from the source to the substrate, and an array of photodetectors arranged along a fast axis perpendicular to the slow axis and receiving portions of the laser radiation reflected from the substrate through the optics. The diode lasers may be implemented as parallel rows of diode lasers along the slow axis. The apparatus can further include a first translation mechanism for varying a distance between (a) the substrate and (b) the optics, and a controller receiving an output of the array of photodetectors and controlling the translation mechanism in response to the output to focus the laser radiation on the substrate. Preferably, the optics are configured to focus the laser radiation on the substrate in a line beam having a long dimension along the slow axis and a short dimension along the fast axis. A second translation mechanism moves the optics and the substrate relative to each other at least in the fast direction.

DETAILED DESCRIPTION OF THE INVENTION

Figure 1:
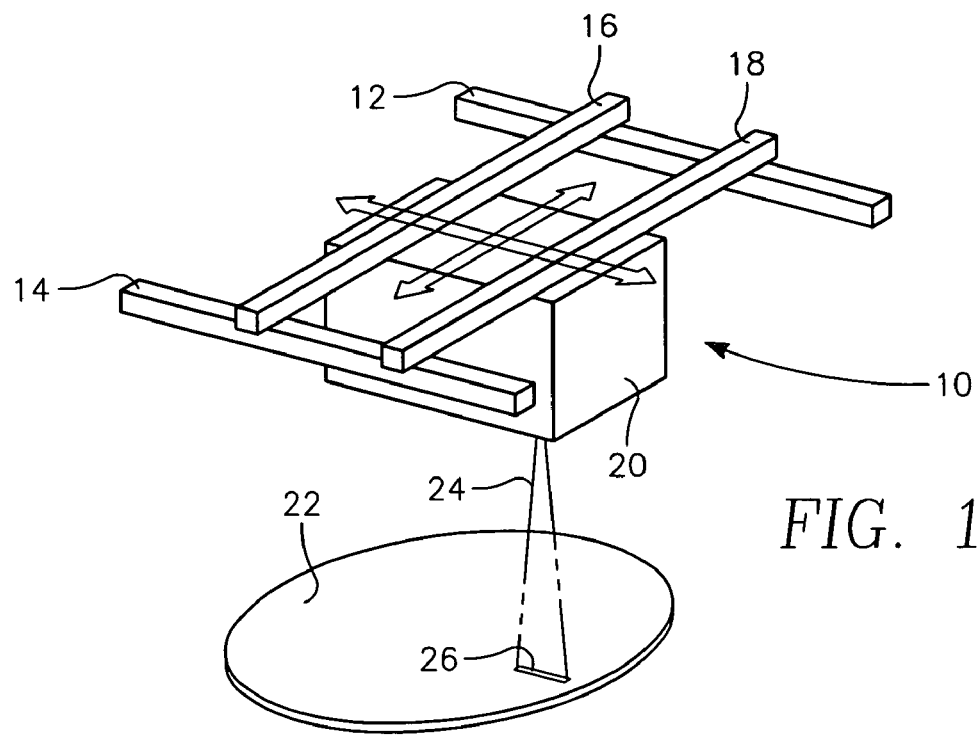
FIG. 1 is an orthographic representation of a thermal flux laser annealing apparatus employed in the present invention.

One embodiment of the apparatus described in the above-referenced application by Jennings et al. is illustrated in the schematic orthographic representation of FIG. 1. A gantry structure 10 for two-dimensional scanning includes a pair of fixed parallel rails 12, 14. Two parallel gantry beams 16, 18 are fixed together a set distance apart and supported on the fixed rails 12, 14 and are controlled by an unillustrated motor and drive mechanism to slide on rollers or ball bearings together along the fixed rails 12, 14. A beam source 20 is slidably supported on the gantry beams 16, 18, and may be suspended below the beams 16, 18 which are controlled by unillustrated motors and drive mechanisms to slide along them. A silicon wafer 22 or other substrate is stationarily supported below the gantry structure 10. The beam source 20 includes a laser light source and optics to produce a downwardly directed fan-shaped beam 24 that strikes the wafer 22 as a line beam 26 extending generally parallel to the fixed rails 12, 14, in what is conveniently called the slow direction. Although not illustrated here, the gantry structure further includes a Z-axis stage for moving the laser light source and optics in a direction generally parallel to the fan-shaped beam 24 to thereby controllably vary the distance between the beam source 20 and the wafer 22 and thus control the focusing of the line beam 26 on the wafer 22. Exemplary dimensions of the line beam 26 include a length of 1 cm and a width of 66 microns with an exemplary power density of 220 kW/cm$^2$. Alternatively, the beam source and associated optics may be stationary while the wafer is supported on a stage which scans it in two dimensions.

In typical operation, the gantry beams 16, 18 are set at a particular position along the fixed rails 12, 14 and the beam source 20 is moved at a uniform speed along the gantry beams 16, 18 to scan the line beam 26 perpendicularly to its long dimension in a direction conveniently called the fast direction. The line beam 26 is thereby scanned from one side of the wafer 22 to the other to irradiate a 1 cm swath of the wafer 22. The line beam 26 is narrow enough and the scanning speed in the fast direction fast enough that a particular area of the wafer is only momentarily exposed to the optical radiation of the line beam 26 but the intensity at the peak of the line beam is enough to heat the surface region to very high temperatures. However, the deeper portions of the wafer 22 are not significantly heated and further act as a heat sink to quickly cool the surface region. Once the fast scan has been completed, the gantry beams 16, 18 are moved along the fixed rails 12, 14 to a new position such that the line beam 26 is moved along its long dimension extending along the slow axis. The fast scanning is then performed to irradiate a neighboring swath of the wafer 22. The alternating fast and slow scanning are repeated, perhaps in a serpentine path of the beam source 20, until the entire wafer 22 has been thermally processed.

The optics beam source 20 includes an array of lasers. An example is orthographically illustrated in FIGS. 2 and 3, in which laser radiation at about 810 nm is produced in an optical system 30 from two laser bar stacks 32, one of which is illustrated in end plan view in FIG. 4. Each laser bar stack 32 includes 14 parallel bars 34, generally corresponding to a vertical p-n junction in a GaAs semiconductor structure, extending laterally about 1 cm and separated by about 0.9 mm. Typically, water cooling layers are disposed between the bars 34. In each bar 34 are formed 49 emitters 36, each constituting a separate GaAs laser emitting respective beams having different divergence angles in orthogonal directions. The illustrated bars 34 are positioned with their long dimension extending over multiple emitters 36 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIGS. 2 and 3 two arrays of cylindrical lenslets 40 are positioned along the laser bars 34 to collimate the laser light in a narrow beam along the fast axis. They may be bonded with adhesive on the laser stacks 32 and aligned with the bars 34 to extend over the emitting areas 36.

Figure 2:
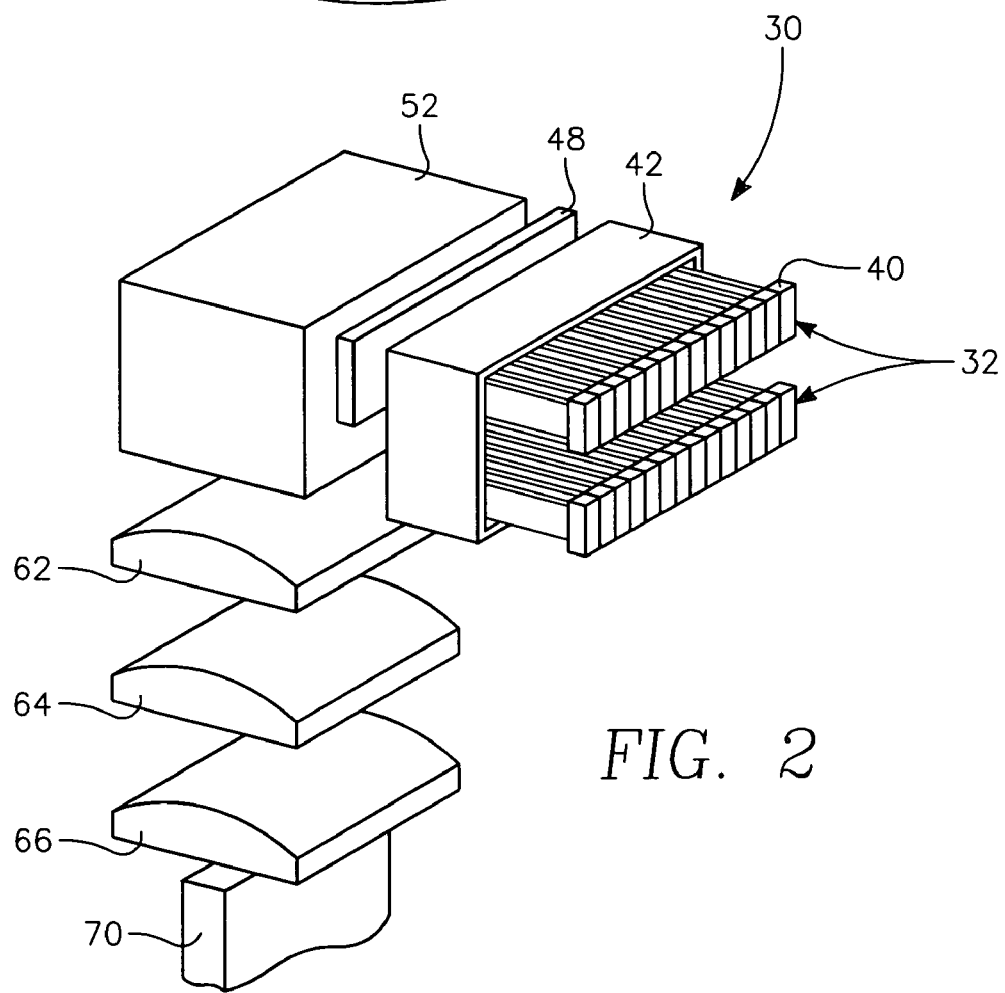
FIGS. 2 and 3 are orthographic views from different perspectives of optical components of the apparatus of FIG. 1.
Figure 3:
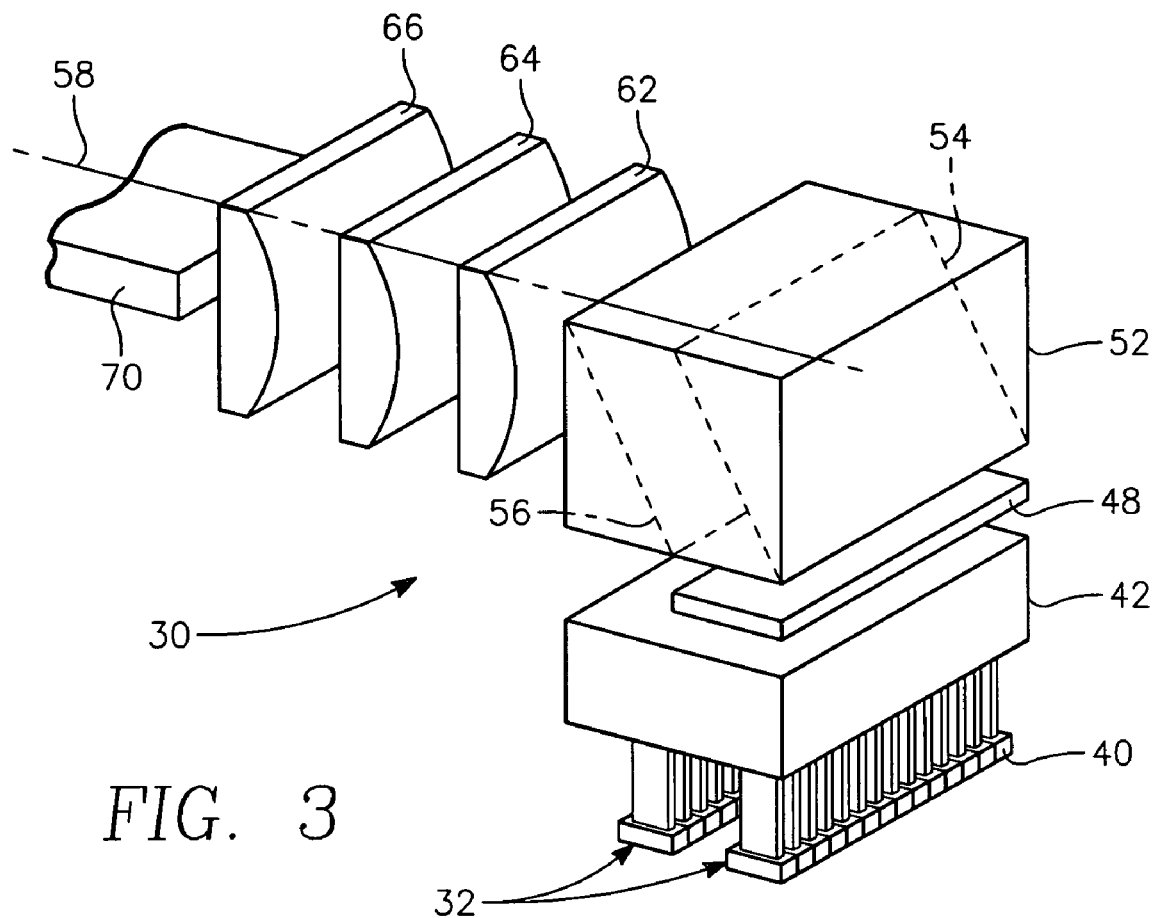
Figure 4:
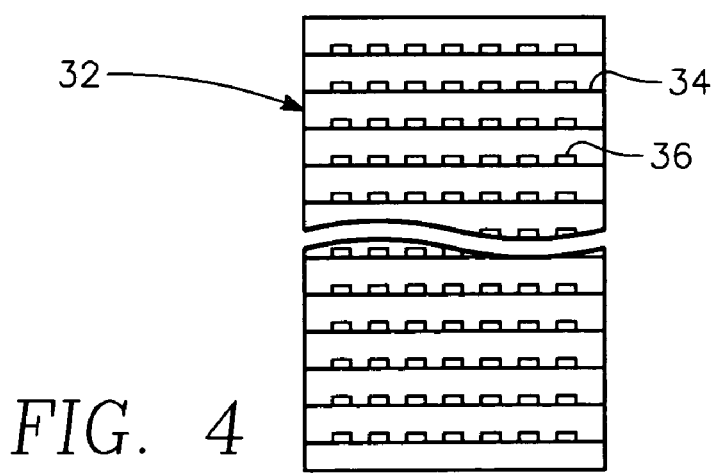
FIG. 4 is an end plan view of a portion of a semiconductor laser array in the apparatus of FIG. 1.

The optics beam source 20 can further include conventional optical elements. Such conventional optical elements can include an interleaver and a polarization multiplexer, although the selection by the skilled worker of such elements is not limited to such an example. In the example of FIGS. 2 and 3, the two sets of beams from the two bar stacks 32 are input to an interleaver 42, which has a multiple beam splitter type of structure and having specified coatings on two internal diagonal faces, e.g., reflective parallel bands, to selectively reflect and transmit light. Such interleavers are commercially available from Research Electro Optics (REO). In the interleaver 42, patterned metallic reflector bands are formed in angled surfaces for each set of beams from the two bar stacks 32 such that beams from bars 34 on one side of the stack 32 are alternatively reflected or transmitted and thereby interleaved with beams from bars 34 on the other side of the stack 32 which undergo corresponding selective transmission/reflection, thereby filling in the otherwise spaced radiation profile from the separated emitters 36.

A first set of interleaved beams is passed through a quarter-wave plate 48 to rotate its polarization relative to that of the second set of interleaved beams. Both sets of interleaved beams are input to a polarization multiplexer (PMUX) 52 having a structure of a double polarization beam splitter. Such a PMUX is commercially available from Research Electro Optics. First and second diagonal interface layers 54, 56 cause the two sets of interleaved beams to be reflected along a common axis from their front faces. The first interface 54 is typically implemented as a dielectric interference filter designed as a hard reflector (HR) while the second interface 56 is implemented as a dielectric interference filter designed as a polarization beam splitter (PBS) at the laser wavelength. As a result, the first set of interleaved beams reflected from the first interface layer 54 strikes the back of the second interface layer 56. Because of the polarization rotation introduced by the quarter-wave plate 48, the first set of interleaved beams passes through the second interface layer 56. The intensity of a source beam 58 output by the PMUX 52 is doubled from that of the either of the two sets of interleaved beams.

Although shown separated in the drawings, the interleaver 42, the quarter-wave plate 48, and the PMUX 52 and its interfaces 54, 56, as well as additional filters that may be attached to input and output faces are typically joined together by a plastic encapsulant, such as a UV curable epoxy, to provide a rigid optical system. An important interface is the plastic bonding of the lenslets 40 to the laser stacks 32, on which they must be aligned to the bars 34. The source beam 58 is passed through a set of cylindrical lenses 62, 64, 66 to focus the source beam 58 along the slow axis.

Figure 5:
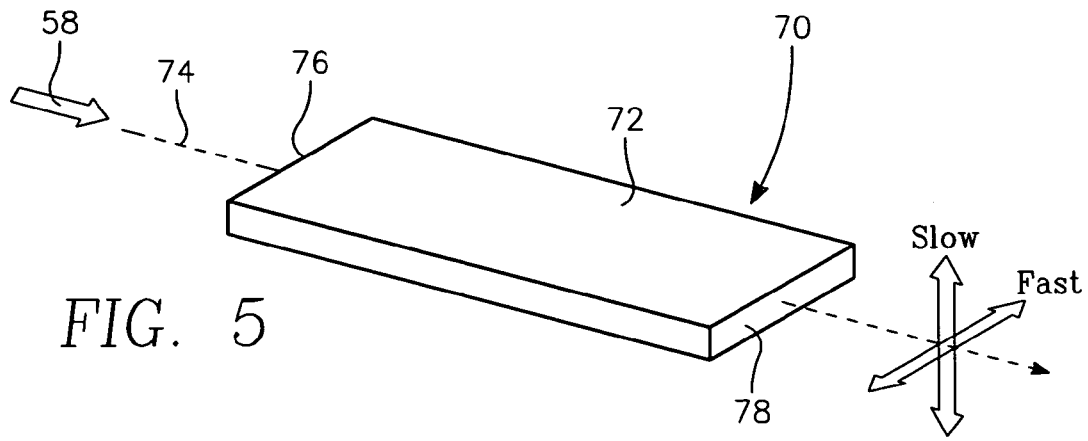
FIG. 5 is an orthographic view of a homogenizing light pipe for the apparatus of FIG. 1.

A one-dimensional light pipe 70 homogenizes the source beam along the slow axis. The source beam, focused by the cylindrical lenses 62, 64, 66, enters the light pipe 70 with a finite convergence angle along the slow axis but substantially collimated along the fast axis. The light pipe 70, more clearly illustrated in the orthographic view of FIG. 5, acts as a beam homogenizer to reduce the beam structure along the slow axis introduced by the multiple emitters 36 in the bar stack 32 spaced apart on the slow axis. The light pipe 70 may be implemented as a rectangular slab 72 of optical glass having a sufficiently high index of refraction to produce total internal reflection. It has a short dimension along the slow axis and a longer dimension along the fast axis. The slab 72 extends a substantial distance along an axis 74 of the source beam 58 converging along the slow axis on an input face 76. The source beam 58 is internally reflected several times from the top and bottom surfaces of the slab 72, thereby removing much of the texturing along the slow axis and homogenizing the beam along the slow axis when it exits on an output face 78. The source beam 58, however, is already well collimated along the fast axis (by the cylindrical lenslets 40) and the slab 72 is wide enough that the source beam 58 is not internally reflected on the side surfaces of the slab 72 but maintains its collimation along the fast axis. The light pipe 70 may be tapered along its axial direction to control the entrance and exit apertures and beam convergence and divergence. The one-dimensional light pipe can alternatively be implemented as two parallel reflective surfaces corresponding generally to the upper and lower faces of the slab 72 with the source beam passing between them.

The source beam output by the light pipe 70 is generally uniform. As further illustrated in the schematic view of FIG. 6, further anamorphic lens set or optics 80, 82 expands the output beam in the slow axis and includes a generally spherical lens to project the desired line beam 26 on the wafer 22. The anamorphic optics 80, 82 shape the source beam in two dimensions to produce a narrow line beam of limited length. In the direction of the fast axis, the output optics have an infinite conjugate for the source at the output of the light pipe (although systems may be designed with a finite source conjugate) and a finite conjugate at the image plane of the wafer 22 while, in the direction of the slow axis, the output optics has a finite conjugate at the source at the output of the light pipe 70 and a finite conjugate at the image plane. Further, in the direction of the slow axis, the nonuniform radiation from the multiple laser diodes of the laser bars is homogenized by the light pipe 70. The ability of the light pipe 70 to homogenize strongly depends on the number of times the light is reflected traversing the light pipe 70. This number is determined by the length of the light pipe 70, the direction of the taper if any, the size of the entrance and exit apertures as well as the launch angle into the light pipe 70. Further anamorphic optics focus the source beam into the line beam of desired dimensions on the surface of the wafer 22.

It is desired to provide autofocusing capability such that the distance between the optics and the wafer 22 may be automatically adjusted in real time to provide a well focused line beam on the wafer 22. Autofocusing is well known in cameras. However, conventional autofocusing techniques cannot easily be applied to the complex optics shown in FIGS. 2 and 3. In particular, the single-axis light pipe 70 providing beam homogenization along the slow axis is inconsistent with conventional autofocusing techniques and mechanisms.

Figure 6:
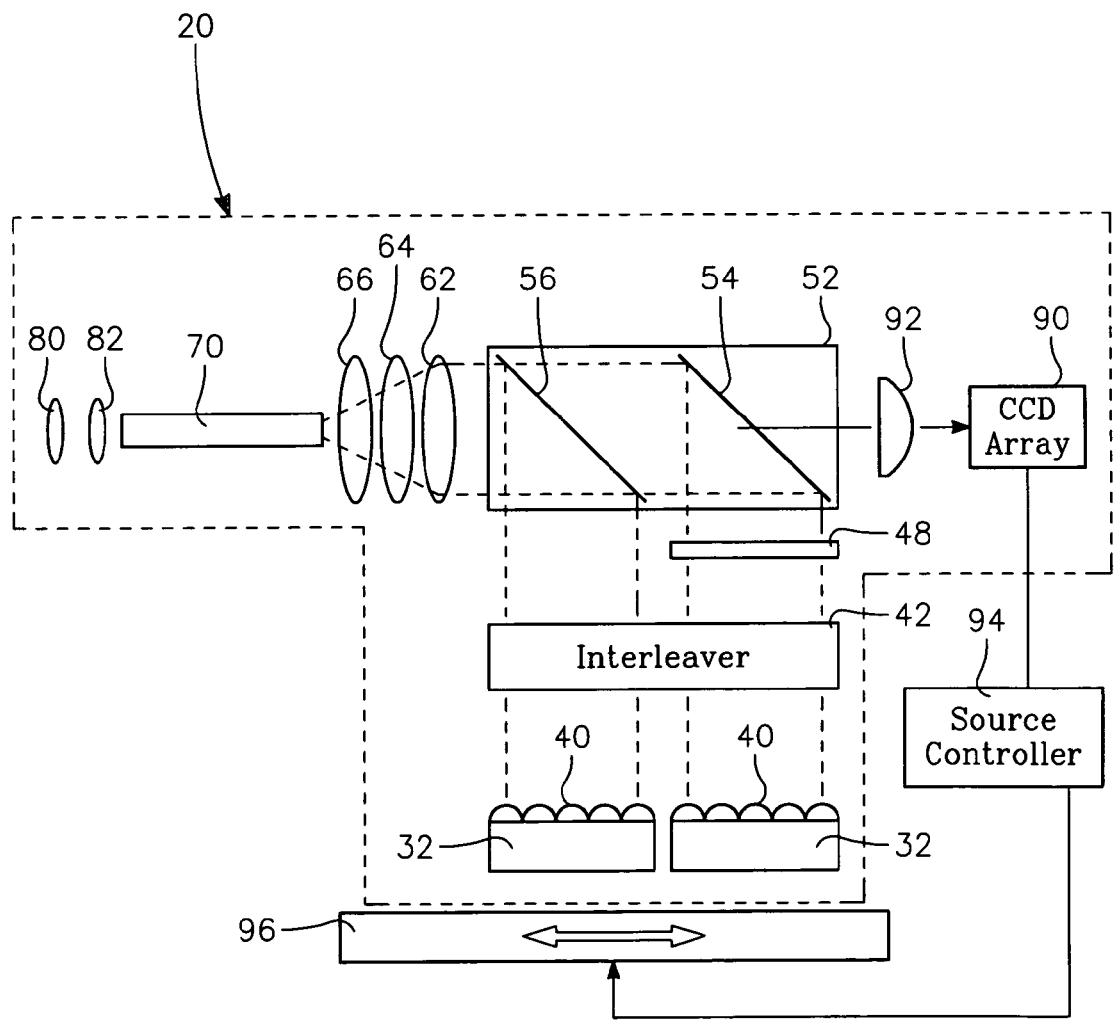
FIG. 6 is a schematic diagram of a preferred embodiment.
Figure 7:
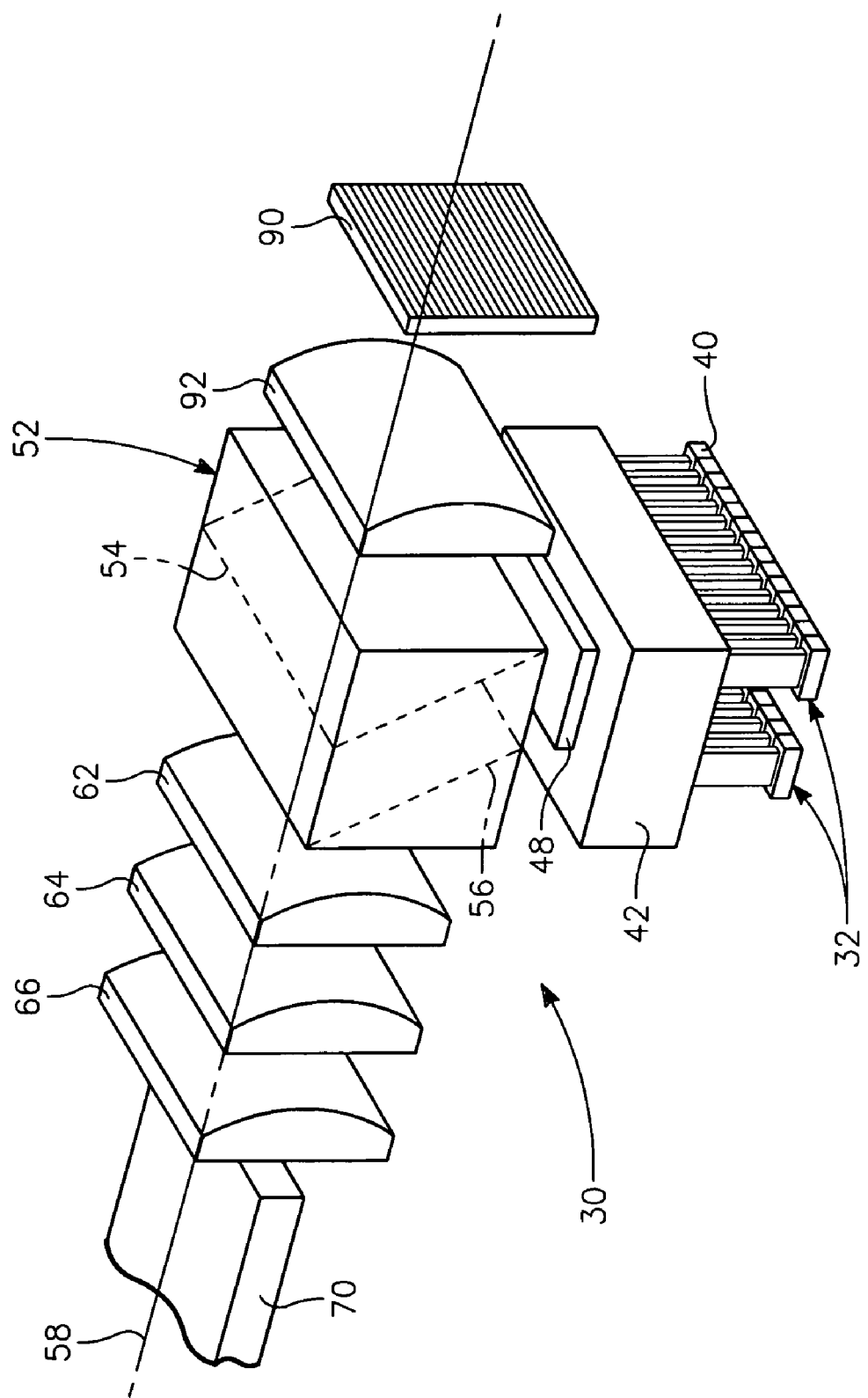
FIG. 7 is an orthographic projection representative of the embodiment of FIG. 6.

In one aspect of the invention, the reflections of the line beam 26 from the wafer are monitored for variations along the fast axis only. As illustrated in FIG. 6 and the orthographic view of FIG. 7, the same optics 62, 64, 66, 80 that project the line beam 26 onto the wafer 22 are also used to guide laser light reflected from the wafer 22 to a CCD array 90 positioned on a side of the PMUX 52 opposite the wafer 22. The light pipe 70 is intermediate the optics 80 and the optical lenses 62, 64, 66. The CCD array 90 includes a plurality of photosensitive charge coupled devices arranged along one axis and possibly along two axes. However, other types of linear or rectangular photodetectors may be employed. The wavelength-selective reflective surfaces 54, 56 in the PMUX 52 are sufficiently inefficient (i.e., have a coefficient of reflection that is less that 100%) so that a small but finite fraction of the laser light reflected from the wafer 22 passes through them to a cylindrical lens 92 (FIG. 6) focusing the reflected light along the slow axis but leaving it substantially collimated along the fast axis as it strikes the CCD array 90. (The fast and slow axes may be projected onto both the wafer 22 as well as the CCD array 90.) The cylindrical lens 92 may be used to reduce the aperture in the slow direction to increase optical throughput since the light pipe 70 suppresses information in this direction. The CCD array 90 provides a fast-axis profile of the light to a source controller 94, which determines if the line beam 26 is adequately focused on the wafer 22 or whether the separation between the beam source 20 and the wafer is too large or too small. Accordingly, the source controller 94 causes a Z-axis stage 96 to which the beam source 20 is mounted in the gantry structure of FIG. 1 to move the beam source 20 toward or away from the wafer for a better focus. It is of course appreciated that the wafer 22 could be supported on a Z-axis stage so it could be moved toward or away from the beam source 20, which otherwise is stationary along the Z-axis.

The angular distribution of light along the fast axis contains information about the location of the reflecting plane, that is, the wafer 22. A model of the ideal (in-focus) fast axis light distribution or profile at the CCD array 90 is determined as are expected fast axis distributions for out-of-focus positions. The return or reflected light distribution is fit to the best model and the focus condition is thereby determined. The nominal best focus is the condition in which all light returns to the same aperture size along the fast axis (at the CCD array 90) as the source aperture for the light initially directed from the laser bars 32 to the wafer.

Figure 8:
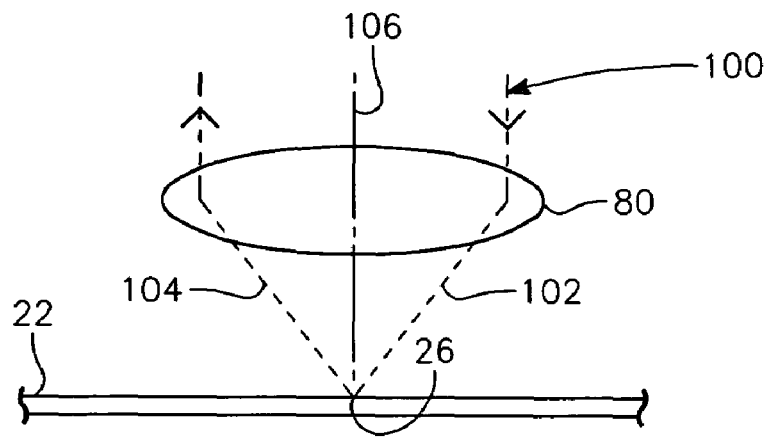
FIGS. 8, 9 and 10 are diagrams of ray traces in the apparatus of FIG. 7 corresponding optics-to-substrate distances that are in-focus, too close and too far, respectively.
Figure 9:
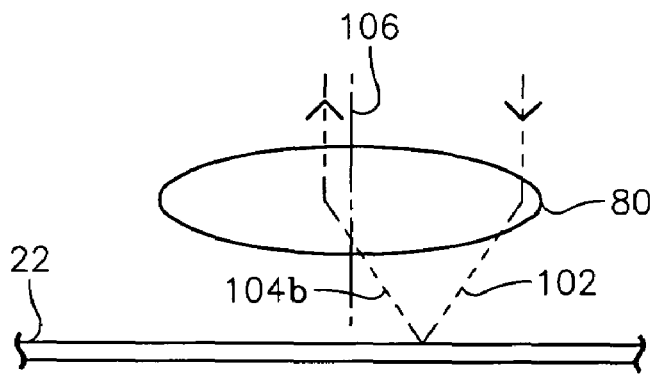
Figure 10:
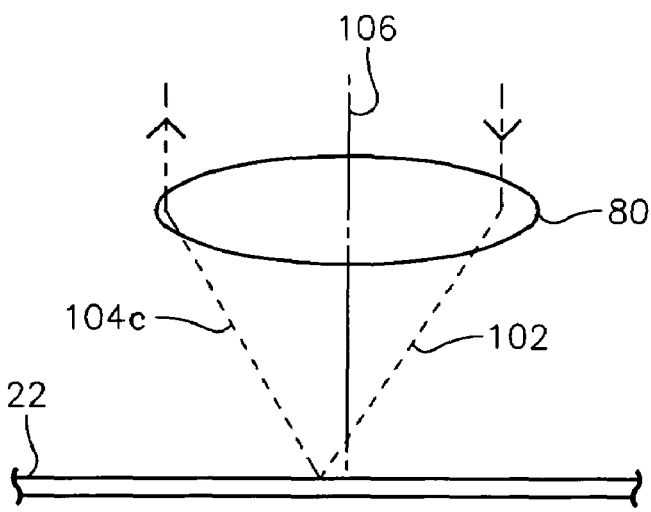

FIG. 8 illustrates the nominal best focus along the fast axis in which the optics 62, 64, 66, 80 focus substantially collimated laser radiation 100 to the line beam on the wafer 22. The outline further shows an incident path 102 and reflected path 104 for a ray on the periphery of the beam arranged around a central axis 106. However, if the wafer 22 is too close to the optics, as illustrated in FIG. 9, the reflected path 104b is closer to the central axis 106 and produces a narrower collimated return beam. On the other hand, if the wafer 22 is too far from the optics, as illustrated in FIG. 10, the return path 104c is further away from the central axis 106 and produces a wider collimated return beam. It is understood that incident rays need to be traced from each side of the central axis 106 to provide a fast-axis profile.

Figure 11:
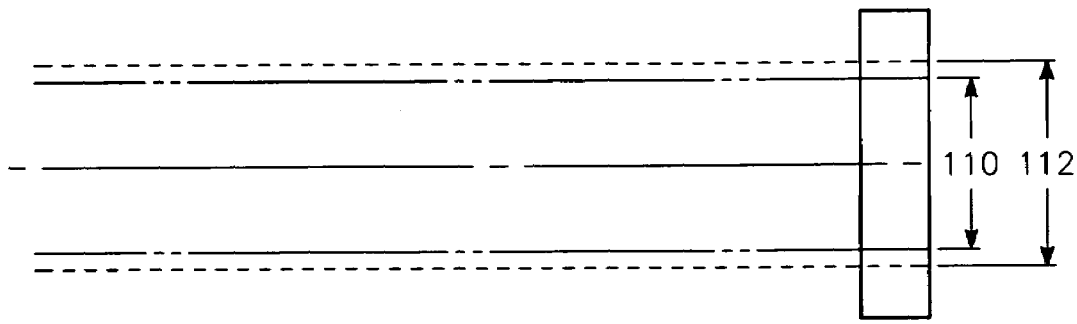
FIGS. 11, 12 and 13 are graphic representations of the incident and reflected light beams along the fast axis for optics-to-substrate distances that are in-focus, too close and too far, respectively.
Figure 12:
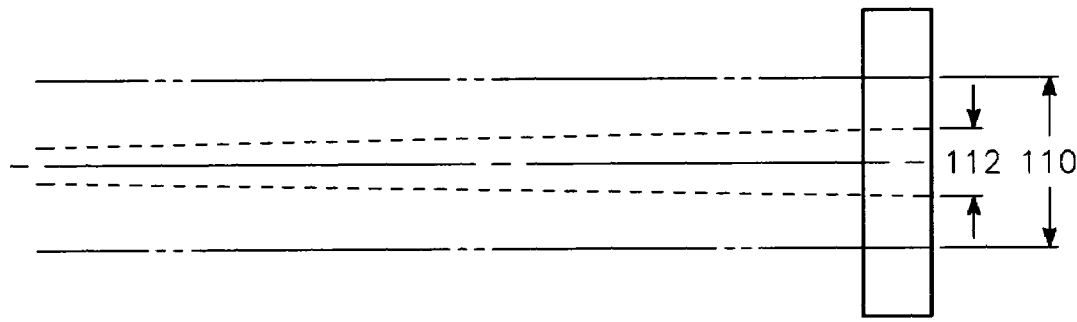
Figure 13:
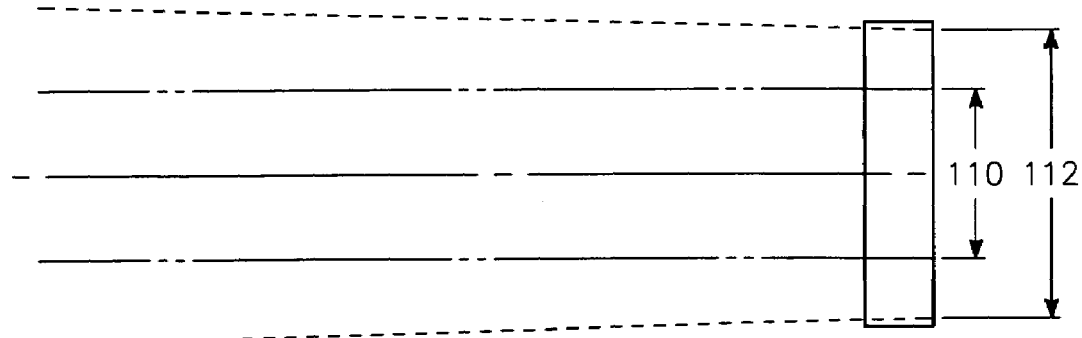
Figure 14:
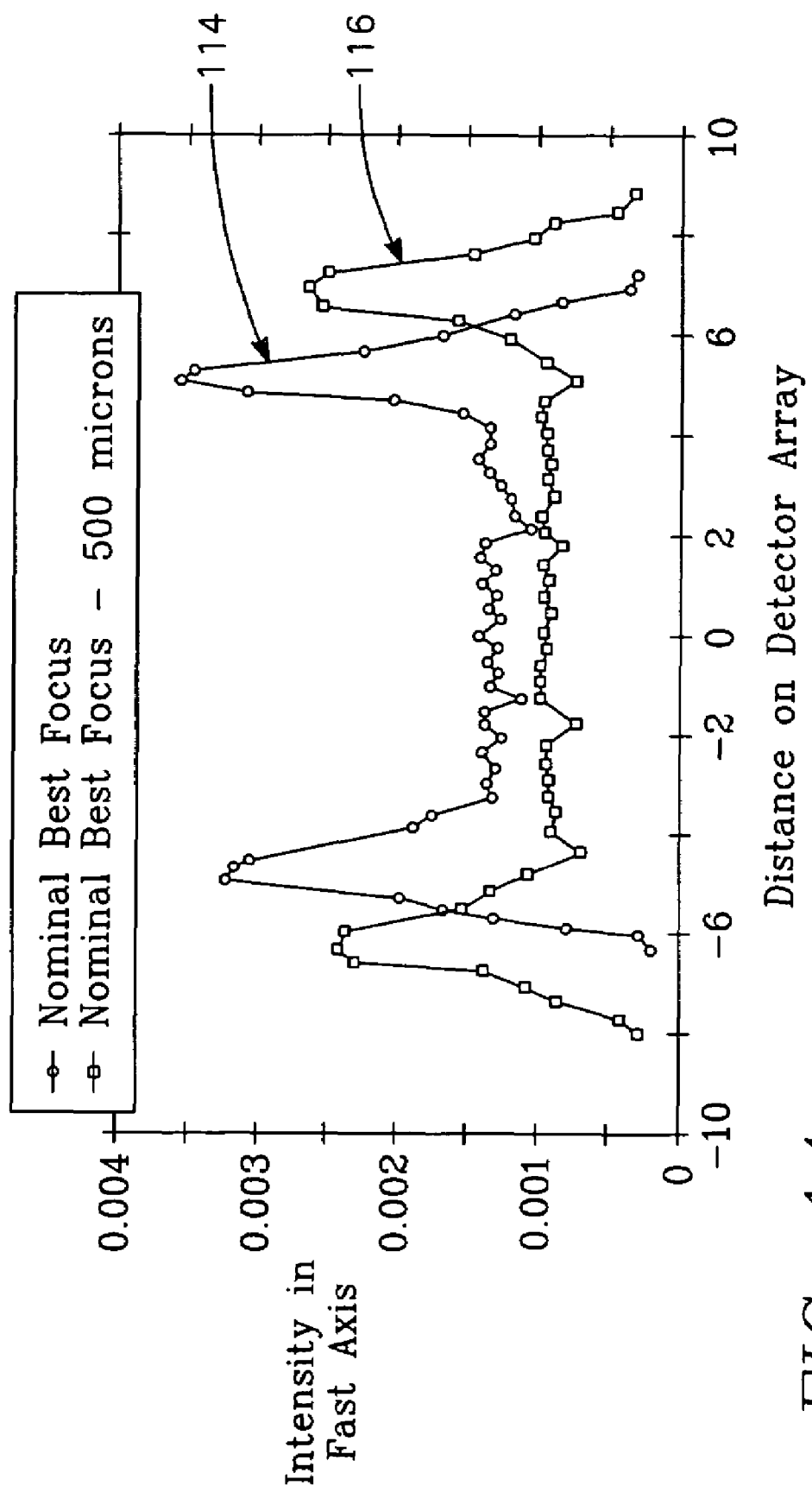
FIG. 14 is a graph of nominal best focus fast axis light intensity profiles for two different optics-to-substrate distances.

A more complete simulation shows the collimated source beam 110 and the collimated return beam 112 near the PMUX for the condition of nominal best focus in FIG. 11, the condition of the wafer being too close to the source in FIG. 12, and the condition of the wafer being too far from the source in FIG. 13. Line 114 in the graph of FIG. 14 shows the fast-axis intensity profile for nominal best focus and line 116 shows the condition of the wafer being 500 microns too far from the source.

It is understood that in some more fundamental aspects of the invention not requiring scanning a line beam, the fast and slow axes can be understood simply as perpendicular first and second axes. It is also understood that the fast and slow axes may change in absolute space as optics redirect the principal optical axis.

In focusing the laser beam, it may not be necessary in some alternative embodiments to move the lasers 32 relative to the substrate 22 or even include the lasers 32 within the optics source 20, provided the other components of the optics source 20 (e.g., lenses 62, 64, 66, 80, and homogenizer 70) are moved relative to the substrate 22.

It may be possible to carry out the invention without either the interleaver 42 or the polarization multiplexer 52 or without both of them. As one possible example, an optical element similar to the reflective surfaces 54, 56 (or similar to one of them) may be employed to carry out the invention, that element not being part of a polarization multiplexer. While the invention has been described in detail by specific reference to preferred embodiments, it is understood that variations and modifications thereof may be made without departing from the true spirit and scope of the invention.

What is claimed is:

1. A method of thermally processing a substrate, said method comprising the steps of:
   irradiating said substrate through optics with laser radiation comprising a line beam having a long dimension along a slow axis and a short dimension along a fast axis from a plurality of laser diodes emitting from respective areas arranged along said slow axis;

determining a profile of respective light intensities along said fast axis of a portion of said laser radiation reflected from respective locations on said substrate distributed along said fast axis; and modifying said profile by changing a distance between said optics and said substrate by movement of said optics and said substrate relative to one another along a direction of propagation of said line beam.

2. The method of claim 1 wherein the step of changing a distance between said optics and said substrate is carried out so as to improve the focus of said line beam on said substrate.

3. The method of claim 1 wherein the step of changing a distance between said optics and said substrate is preceded by a step of comparing said profile with an ideal profile, wherein the step of changing said distance between said optics and said substrate is carried out in response to said comparison.

4. The method of claim 3 wherein said ideal profile corresponds to an in-focus condition.

5. The method of claim 1 wherein said irradiating and determining steps use a common set of optics.

6. The method of claim 5, further comprising homogenizing said laser radiation along said slow axis within said common set of optics.

7. The method of claim 5 wherein:

the step of irradiating comprises passing said laser radiation in a forward direction through said common optics to said substrate; and the step of determining a profile along said fast axis comprises passing a portion of the laser radiation reflected from said substrate through said common optics in a reverse direction to an array of photodetectors and sensing the output of said photodetectors.

8. The method of claim 1 wherein the step of changing the distance between said optics and said substrate is preceded by a step of finding from said profile whether the distance between said optics and said substrate is one of: (a) too large, (b) too small, (c) correct.

9. The method of claim 8 wherein the step of finding from said profile whether the distance between said optics and said substrate is one of (a) too large, (b) too small, (c) correct corresponds to a comparison of said profile with predetermined profiles representing optics-to-substrate distances that are, respectively, too large, too small and ideal.

10. The method of claim 1, further comprising translating said optics and substrate relative to each other at least along said fast axis.

11. The method of claim 1, further comprising scanning said line beam across said substrate along said fast axis.

* * * * *